United States Patent
Tsai (10) Patent No.: US 11,984,511 B2
(45) Date of Patent: May 14, 2024

(54) MANUFACTURING METHOD OF SEMICONDUCTOR DEVICE

(71) Applicant: NANYA TECHNOLOGY CORPORATION, New Taipei (TW)

(72) Inventor: Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 394 days.

(21) Appl. No.: 17/444,835

(22) Filed: Aug. 11, 2021

(65) Prior Publication Data
US 2021/0376165 A1 Dec. 2, 2021

Related U.S. Application Data (62) Division of application No. 16/435,584, filed on Jun. 10, 2019, now Pat. No. 11,127,859.

(51) Int. Cl.
*H01L 29/786* (2006.01)
*H01L 21/306* (2006.01)
(Continued)

(52) U.S. Cl.
CPC ...... *H01L 29/78696* (2013.01); *H01L 21/306* (2013.01); *H01L 21/762* (2013.01);
(Continued)

(58) Field of Classification Search
CPC ..... H01L 29/42392; H01L 29/06–0611; H01L 29/1037; H01L 29/40; H01L 29/401;
(Continued)

(56) References Cited

U.S. PATENT DOCUMENTS 5,990,509 A * 11/1999 Burns, Jr. ............... H10B 12/50
438/257
2017/0373159 A1 12/2017 Cheng et al.
(Continued)

FOREIGN PATENT DOCUMENTS

TW 201721759 A 6/2017

OTHER PUBLICATIONS

Mallory Mativenga, "Bulk Accumulation a-IGZO TFT for High Current and Turn-On Voltage Uniformity" No. 12, vol. 34, IEEE Electron Device Letters, Oct. 24, 2013.

*Primary Examiner* — Moin M Rahman
*Assistant Examiner* — Eric Manuel Mulero Flores
(74) *Attorney, Agent, or Firm* — CKC & Partners Co., LLC (57) ABSTRACT

A semiconductor device includes a channel structure, a dielectric structure, a gate structure, a first conductive structure, and a second conductive structure. The channel structure has a top surface, a bottom surface, and a sidewall extending from the top surface to the bottom surface. The first conductive structure is disposed on the bottom surface of the channel structure and includes a body portion and at least one convex portion, and a top surface of the convex portion is higher than a top surface of the body portion. The second conductive structure is disposed on the top surface of the channel structure and includes a body portion and at least one convex portion, and a bottom surface of the body portion is higher than a bottom surface of the convex portion.

6 Claims, 10 Drawing Sheets

(51) Int. Cl.
    *H01L 21/762*     (2006.01)
    *H01L 27/07*     (2006.01)
    *H01L 29/06*     (2006.01)
    *H01L 29/423*     (2006.01)
    *H01L 29/66*     (2006.01)

(52) U.S. Cl.
    CPC ...... H01L 27/0733 (2013.01); H01L 29/0649 (2013.01); H01L 29/42384 (2013.01); H01L 29/66969 (2013.01); H01L 29/7869 (2013.01)

(58) Field of Classification Search
    CPC ......... H01L 29/41725; H01L 29/41733; H01L 29/41741; H01L 29/41783; H01L 29/66045; H01L 29/66795; H01L 29/66818; H01L 29/7858; H01L 29/13067; H01L 29/7802; H01L 29/7827; H01L 29/78696; H01L 21/823841; H01L 21/845; H01L 27/0886; H01L 27/0924; H01L 27/1211; H01L 21/8234–8249; H01L 29/66477–6684; H01L 29/78–7926; H01L 29/107–1087; H10B 12/02; H10B 12/05–056; H10B 12/30; H10B 12/34; H10B 12/36; H10B 61/22; H10B 63/34
    See application file for complete search history.

(56) References Cited

U.S. PATENT DOCUMENTS

2018/0240873 A1\*   8/2018   Cheng ................. H01L 29/6656
2019/0067475 A1\*   2/2019   Liu ...................... H01L 29/267

\* cited by examiner

MANUFACTURING METHOD OF SEMICONDUCTOR DEVICE

RELATED APPLICATIONS

This application is a Divisional Application of the U.S. application Ser. No. 16/435,584, filed Jun. 10, 2019, which is herein incorporated by reference.

BACKGROUND

Field of Invention

The present disclosure relates to a manufacturing method of a semiconductor device.

Description of Related Art

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

SUMMARY

The present disclosure relates in general to a semiconductor device and a manufacturing method thereof. In the semiconductor device of the present disclosure, a gate all around structure is provided, and at least one convex portion of each of the first conductive structure and the second conductive structure protrude into the channel structure; accordingly, source/gate and drain/gate overlap regions can be controlled, resistance can be decreased, and a gate controllability can be enhanced to further increase an electron mobility of the device.

According to an embodiment of the present disclosure, a semiconductor device includes a channel structure, a dielectric structure, a gate structure, a first conductive structure, and a second conductive structure. The channel structure has a top surface, a bottom surface, and a sidewall extending from the top surface to the bottom surface. The dielectric structure surrounds the sidewall of the channel structure. The gate structure surrounds the dielectric structure. The first conductive structure is disposed on the bottom surface of the channel structure. The first conductive structure includes a body portion and at least one convex portion, and a top surface of the convex portion of the first conductive structure is higher than a top surface of the body portion of the first conductive structure. The second conductive structure is disposed on the top surface of the channel structure. The second conductive structure includes a body portion and at least one convex portion, and a bottom surface of the body portion of the second conductive structure is higher than a bottom surface of the convex portion of the second conductive structure.

In an embodiment of the present disclosure, the semiconductor device further includes a first isolation structure and a second isolation structure. The first isolation structure surrounds a portion of the body portion of the first conductive structure. The second isolation structure surrounds a portion of the body portion of the second conductive structure.

In an embodiment of the present disclosure, a distance between the top surface of the body portion of the first conductive structure and the bottom surface of the body portion of the second conductive structure is identical to a height of the dielectric structure.

In an embodiment of the present disclosure, a distance between the top surface of the body portion of the first conductive structure and the bottom surface of the body portion of the second conductive structure is smaller than a height of the dielectric structure.

In an embodiment of the present disclosure, a portion of the body portion of the first conductive structure and a portion of the body portion of the second conductive structure are in contact with the dielectric structure.

In an embodiment of the present disclosure, the semiconductor device further includes a capacitor electrically connected to the body portion of the first conductive structure or the body portion of the second conductive structure.

In an embodiment of the present disclosure, a number of the convex portion of the first conductive structure is identical to a number of the convex portion of the second conductive structure.

In an embodiment of the present disclosure, the first conductive structure is symmetrical to the second conductive structure with respect to the channel structure.

In an embodiment of the present disclosure, the channel structure comprises at least two concave portions engaged with the convex portion of the first conductive structure and the convex portion of the second conductive structure, respectively.

In an embodiment of the present disclosure, a material of the channel structure includes oxide.

In an embodiment of the present disclosure, the first conductive structure is made of a material including molybdenum, niobium, tantalum, tungsten, or combinations thereof.

In an embodiment of the present disclosure, the second conductive structure is made of a material including molybdenum, niobium, tantalum, tungsten, or combinations thereof.

In an embodiment of the present disclosure, the gate structure is made of a material including aluminum, chromium, copper, tantalum, tungsten, polysilicon, or combinations thereof.

According to an embodiment of the present disclosure, the manufacturing method of the semiconductor device includes the following steps of: forming a gate structure on a top surface of an first isolation structure; replacing a portion of the gate structure with a dielectric structure; removing a center portion of the gate structure and a center portion of the first isolation structure to form a through hole; filling a first conductive structure in a bottom portion of the through hole, in which the first conductive structure includes a body portion and at least one convex portion, and a top surface of the convex portion of the first conductive structure is higher than a top surface of the body portion of the first conductive structure; filling a channel structure in a portion of the through hole, in which the channel structure includes at least one recess indenting from a top surface of the channel structure; and forming a second conductive structure on the channel structure, in which the second conductive structure includes a body portion and at least one convex portion, and the convex portion of the second conductive structure is engaged with the recess of the channel structure.

In an embodiment of the present disclosure, the manufacturing method of the semiconductor device further includes: forming a second isolation structure in a portion of the through hole and on the gate structure and the dielectric structure; and removing a portion of the second isolation structure such that the first conductive structure is exposed from the through hole.

In an embodiment of the present disclosure, the manufacturing method of the semiconductor device further includes: removing a portion of the first isolation structure such that a sidewall of the body portion of the first conductive structure is exposed.

In an embodiment of the present disclosure, replacing the portion of the gate structure with the dielectric structure includes: removing a portion of the gate structure to form a hollow region surrounding the center portion of the gate structure; and filling the dielectric structure in the hollow region.

In an embodiment of the present disclosure, filling the first conductive structure in the bottom portion of the through hole includes: performing an etching process to the first conductive structure to form the convex portion of the first conductive structure.

In an embodiment of the present disclosure, filling the channel structure in the portion of the through hole includes: performing an etching process to the channel structure to form the recess of the channel structure.

In an embodiment of the present disclosure, the manufacturing method of the semiconductor device further includes: forming a capacitor electrically connected to the body portion of the first conductive structure or the body portion of the second conductive structure.

In the aforementioned embodiments of the present disclosure, since the first conductive structure and the second conductive structure protrude into the channel structure, the source/gate and drain/gate overlap regions can be controlled such that current of activation state between the drain and the source (IDS) can be increased. Furthermore, contact areas between each of the first conductive structure and the second conductive and the channel structure can be increased by the convex portion of each of the first conductive structure and the second conductive structure to further decrease the resistance of the semiconductor device. In addition, the manufacturing method of the semiconductor device provides a means for forming the first conductive structure (i.e., the drain region), the channel structure, and the second conductive structure (i.e., the source region) sequentially in an oxide semiconductor thin film transistor (OS TFT). In other words, the source region and the drain region are formed in such a manner without doping, such that the source/gate and drain/gate overlap regions can be controlled.

BRIEF DESCRIPTION OF THE DRAWINGS

The disclosure can be more fully understood by reading the following detailed description of the embodiments, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1:
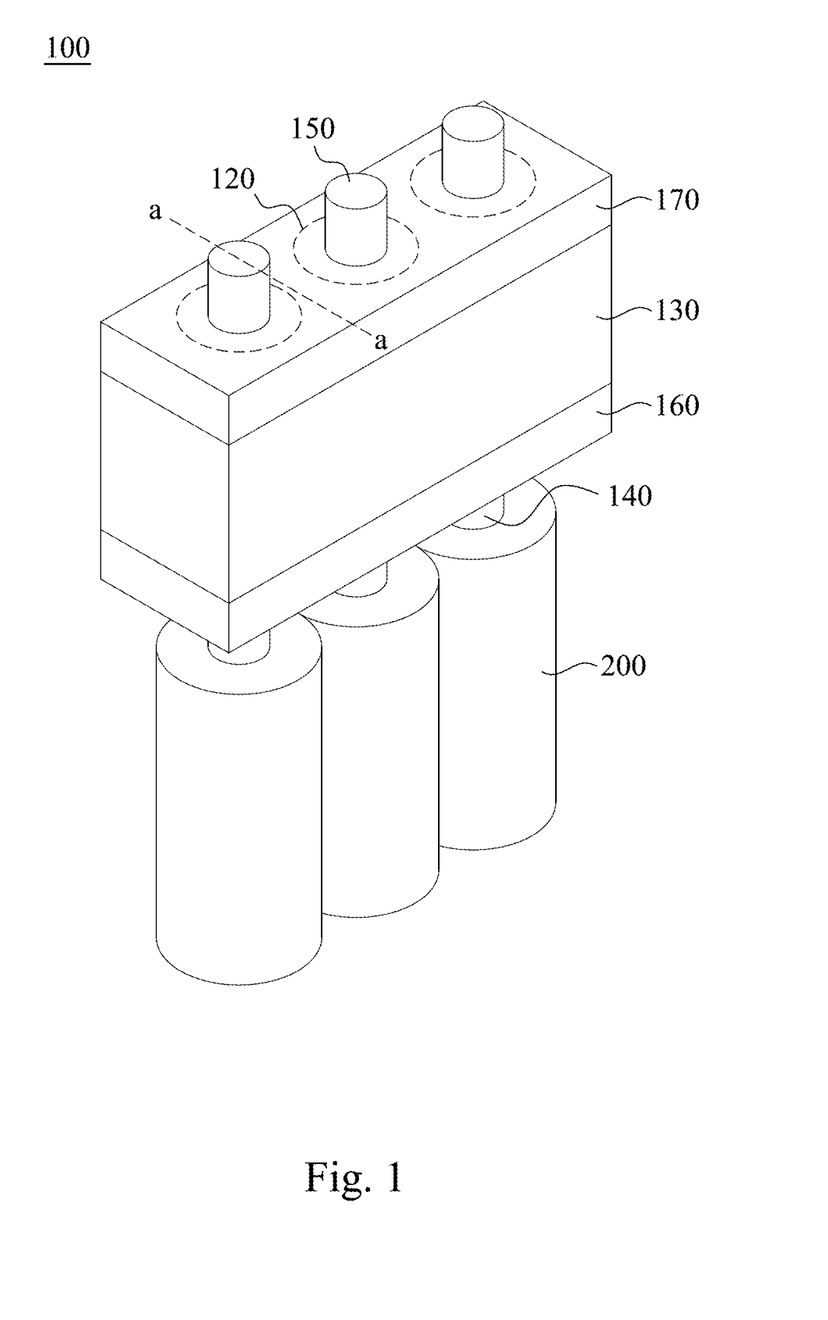
FIG. 1 is a perspective view of a semiconductor device according to an embodiment of the present disclosure.
Figure 2:
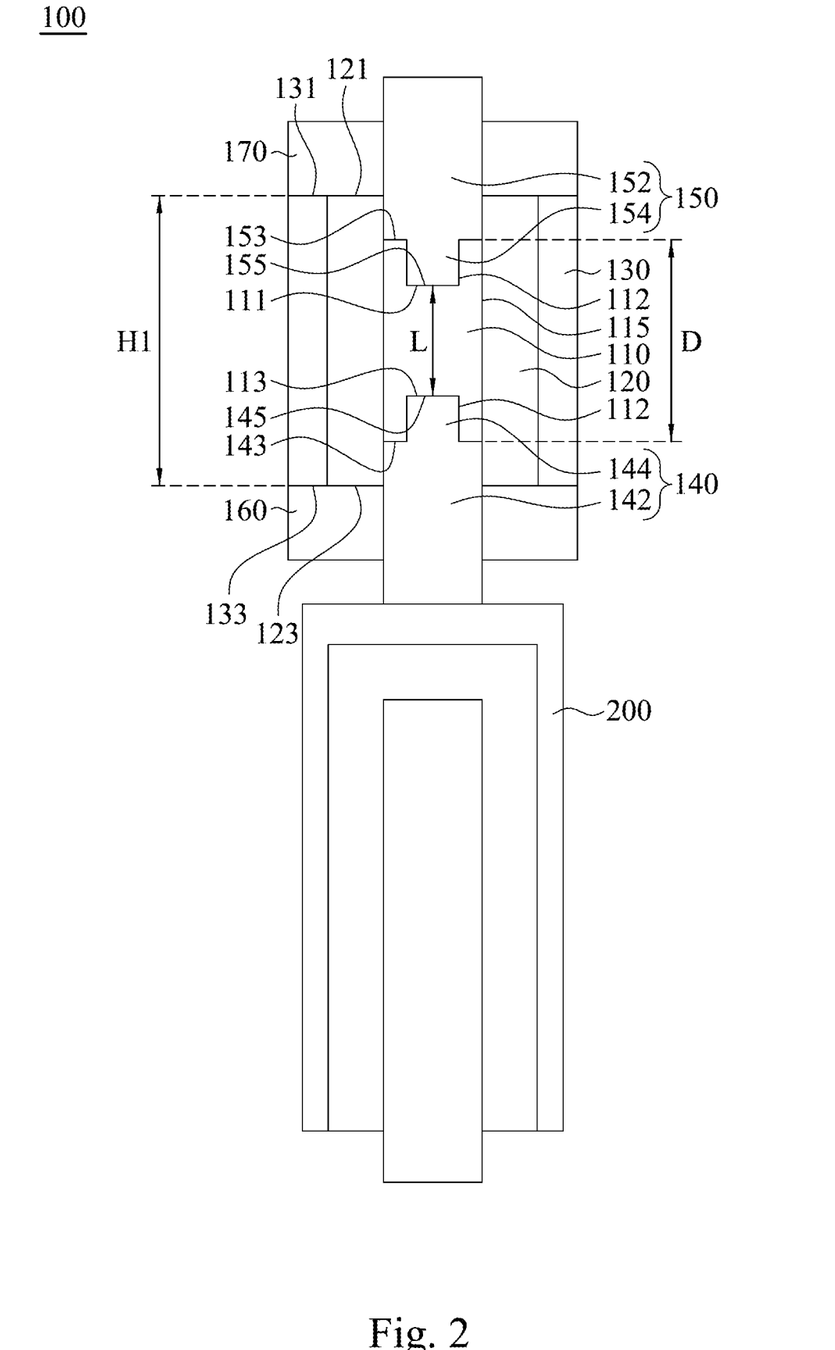
FIG. 2 is a cross-sectional view of the semiconductor device shown in FIG. 1.

FIG. 1 is a perspective view of a semiconductor device 100 according to an embodiment of the present disclosure. FIG. 2 is a cross-sectional view of the semiconductor device 100 taken along line a-a shown in FIG. 1. It is noted that although FIG. 1 illustrates three semiconductor devices 100, the following description will be focus on only one semiconductor device 100 for simplicity and clarity.

Reference is made to FIGS. 1 and 2, in which a semiconductor device 100 includes a channel structure 110, a dielectric structure 120, a gate structure 130, a first conductive structure 140, and a second conductive structure 150. The channel structure 110 has a top surface 111, a bottom surface 113, and a sidewall 115 extending from the top surface 111 to the bottom surface 113. The dielectric structure 120 surrounds the sidewall 115 of the channel structure 110. The gate structure 130 surrounds the dielectric structure 120. The first conductive structure 140 is disposed on the bottom surface 113 of the channel structure 110 and includes a body portion 142 and at least one convex portion 144, and a top surface 145 of the convex portion 144 of the first conductive structure 140 is higher than a top surface 143 of the body portion 142 of the first conductive structure 140. The second conductive structure 150 is disposed on the top surface 111 of the channel structure 110 and includes a body portion 152 and at least one convex portion 154, and a bottom surface 153 of the body portion 152 of the second conductive structure 150 is higher than a bottom surface 155 of the convex portion 154 of the second conductive structure 150. As such, the first conductive structure 140 and the second conductive structure 150 protrude into the channel structure 110.

In some embodiments, the first conductive structure 140 serves as a drain region and the second conductive structure 150 serves as a source region, but the present disclosure is not limited in this regard. In other embodiments, the first conductive structure 140 serves as a source region and the second conductive structure 150 serves as a drain region. Furthermore, the region between the first conductive structure 140 and the second conductive structure 150 serves as a channel region. In some embodiments, the first conductive structure 140 and the second conductive structure 150 may be made of a material including molybdenum, niobium, tantalum, tungsten, or combinations thereof, such as a compound material including molybdenum, niobium, tantalum, tungsten, or combinations thereof. Furthermore, the gate structure 130 may be made of a material including aluminum, chromium, copper, tantalum, tungsten, or combinations thereof, such as a compound material or an alloy material including aluminum, chromium, copper, tantalum, tungsten, or combinations thereof, but the present disclosure is not limited in this regard. In an alternative embodiment, the gate structure 130 may be made of a material including polysilicon.

Since the first conductive structure 140 and the second conductive structure 150 protrude into the channel structure 110, the source/gate and drain/gate overlap regions can be controlled such that the current of activation state between the drain and the source (IDS) can be increased. Furthermore, the contact areas between each of the first conductive structure 140 and the second conductive 150 and the channel structure 110 can be increased by the convex portions 144, 154 of each of the first conductive structure 140 and the second conductive structure 150 to further decrease the resistance of the semiconductor device 100.

In some embodiments, the channel structure 110 includes two concave portions 112 engaged with the convex portion 144 of the first conductive structure 140 and the convex portion 154 of the second conductive structure 150, respectively. In other words, shapes of the two concave portions 112 of the channel structure 110 are identical to a shape of the convex portion 144 of the first conductive structure 140 and a shape of the convex portion 154 of the second conductive structure 150, respectively.

In some embodiments, the channel structure 110 may be made of a material including oxide. For example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also represented as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide, but the present disclosure is not limited in this regard.

The semiconductor device 100 further includes a capacitor 200 electrically connected to the body portion 142 of the first conductive structure 140 or the body portion 152 of the second conductive structure 150. In other words, the capacitor 200 may be electrically connected to the source region or the drain region of the semiconductor device 100. In some embodiments, there may be one or more than one conductive wires (not shown in the drawings) electrically connecting the source/drain region to the capacitor 200.

In some embodiments, the semiconductor device 100 further includes a first isolation structure 160 and a second isolation structure 170. The first isolation structure 160 surrounds a portion of the body portion 142 of the first conductive structure 140 and is disposed on a bottom surface 123 of the dielectric structure 120 and a bottom surface 133 of the gate structure 130. The second isolation structure 170 surrounds a portion of the body portion 152 of the second conductive structure 150 and is disposed on a top surface 121 of the dielectric structure 120 and a top surface 131 of the gate structure 130. In some embodiments, the first isolation structure 160 may be made of a material including nitride or a combination of nitride and oxide, such as a multilayer of nitride and oxide, and the second isolation structure 170 may be made of the same material as the first isolation structure 160, but the present disclosure is not limited in this regard. Furthermore, the first isolation structure 160 and the second isolation structure 170 are in contact with the dielectric structure 120 and the gate structure 130 to ensure the first conductive structure 140 and the second conductive structure 150 being completely separated from the gate structure 130 during a bonding of the conductive wire from the source/drain region to the capacitor 200.

In some embodiments, a distance D between the top surface 143 of the body portion 142 of the first conductive structure 140 and the bottom surface 153 of the body portion 152 of the second conductive structure 150 is smaller than a height H1 of the dielectric structure 120. In other words, the dielectric structure 120 not only surrounds the channel structure 110 but also surrounds a portion of the body portion 142 of the first conductive structure 140 and a portion of the body portion 152 of the second conductive structure 150. Furthermore, the surrounded portion of the body portion 142 of the first conductive structure 140 and the surrounded portion of the body portion 152 of the second conductive structure 150 are in contact with the dielectric structure 120.

Figure 3:
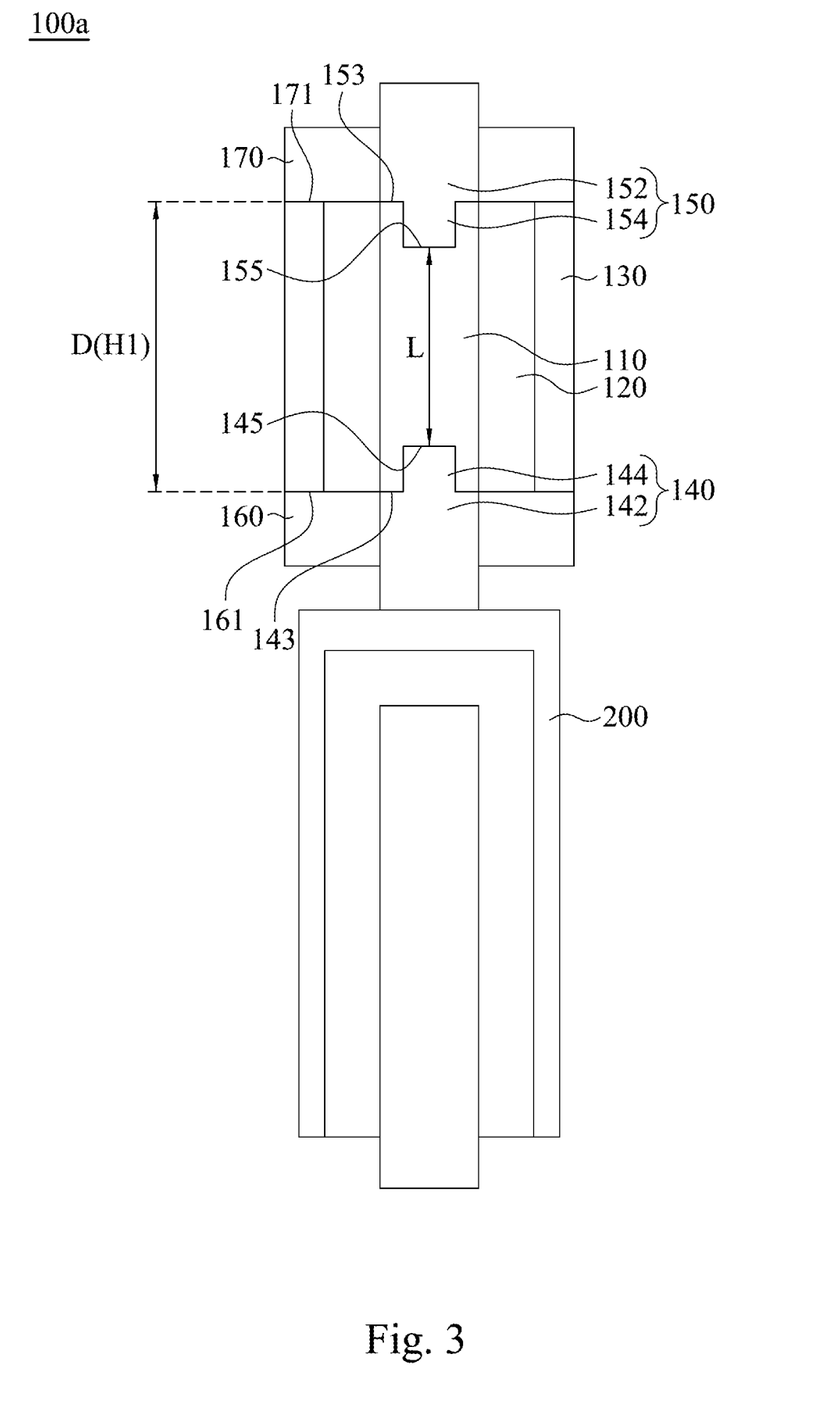
FIG. 3 is a cross-sectional view of the semiconductor device according to another embodiment of the present disclosure.

FIG. 3 is a cross-sectional view of the semiconductor device 100a according to another embodiment of the present disclosure, which is also taken along line a-a shown in FIG. 1. In comparison with the semiconductor device 100 shown in FIG. 2, the distance D between the top surface 143 of the body portion 142 of the first conductive structure 140 and the bottom surface 153 of the body portion 152 of the second conductive structure 150 is identical to the height H1 of the dielectric structure 120 in the semiconductor device 100a. Hence, the top surface 143 of the body portion 142 of the first conductive structure 140 is substantially aligned with a top surface 161 of the first isolation structure 160, and the bottom surface 153 of the body portion 152 of the second conductive structure 150 is substantially aligned with a bottom surface 171 of the second isolation structure 170.

Reference is made to FIGS. 2 and 3. A length L of the channel region depends on the structural configurations of the first conductive structure 140 and the second conductive structure 150. It is noted that the length L herein is referred to as a distance between the top surface 145 of the convex portion 144 of the first conductive structure 140 and the bottom surface 155 of the convex portion 154 of the second conductive structure 150. For example, the semiconductor device 100 shown in FIG. 2 has a channel region with a smaller length L since the first conductive structure 140 and the second conductive structure 150 bury deeply in the channel structure 110. On the contrary, the semiconductor device 100a shown in FIG. 3 has channel region with a greater length L since the first conductive structure 140 and the second conductive structure 150 bury shallowly in the channel structure 110.

Figure 4:
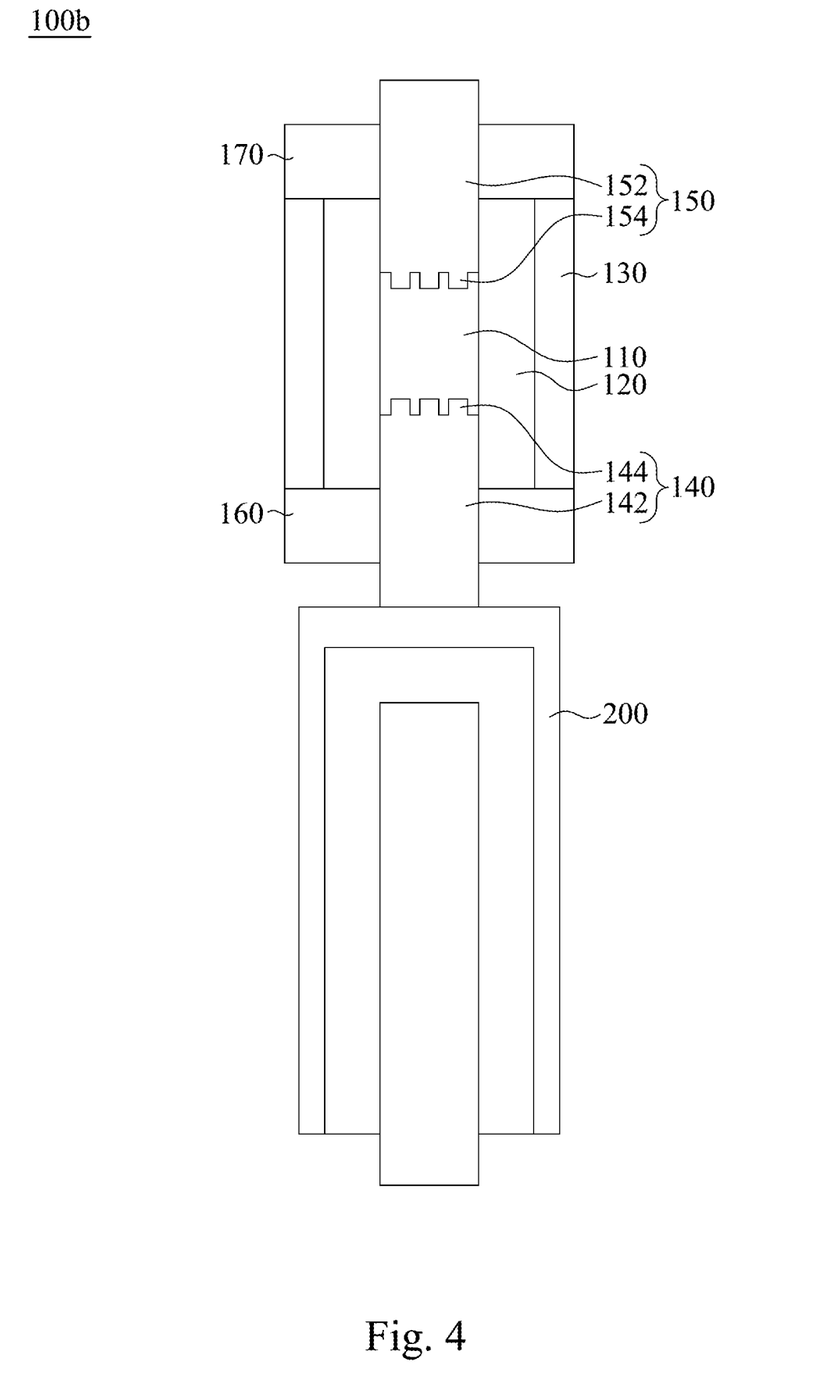
FIG. 4 is a cross-sectional view of the semiconductor device according to another embodiment of the present disclosure.

FIG. 4 is a cross-sectional view of the semiconductor device 100b according to another embodiment of the present disclosure, which is also taken along line a-a shown in FIG. 1. In some embodiments, a number of the convex portion 144 of the first conductive structure 140 may be more than one. Similarly, a number of the convex portion 154 of the second conductive structure 150 may also be more than one. Any number of the convex portions 144, 154 may be designed in the semiconductor device 100b, such as, for example, the three convex portions 144 and the three convex portions 154 (i.e., the six convex portions 144, 154 in total) shown in the cross-sectional view of the semiconductor device 100b in FIG. 4. However, it is noted that since FIG. 4 is merely a cross-sectional view of the semiconductor device 100b, it may actually include more than six convex portions 144, 154 in the semiconductor device 100b.

Accordingly, the contact areas between each of the first conductive structure 140 and the second conductive 150 and the channel structure 110 increase as more convex portions 144, 154 are included in the semiconductor device 100b. As such, the resistance of the semiconductor device 100b may be decreased to further increase the current of activation state between the drain and the source (IDS) and the electron mobility of the semiconductor device 100b.

Reference is made to FIG. 4. The number of the convex portion 144 of the first conductive structure 140 may be identical to the number of the convex portion 154 of the second conductive structure 150. Moreover, the first conductive structure 140 may be symmetrical to the second conductive structure 150 with respect to the channel structure 110. In some embodiments, different sizes and shapes of the convex portions 144, 154 may also be included in the semiconductor device 100b to achieve the aforementioned effects of the present disclosure. However, the present disclosure is not limited in this regard, and the numbers, shapes, and sizes of the convex portions 144, 154 and the structural configurations of the first conductive structure 140 and the second conductive structure 150 may be designed as deemed necessary by designers.

FIGS. 5-16 are cross-sectional views taken along line a-a shown in FIG. 1 of a process at various stages of a manufacturing method of a semiconductor device 100 according to an embodiment of the present disclosure. It is noted that the connection relationships, the materials, and the advantages of the elements described above will not be repeated. In the following description, a manufacturing method of a semiconductor device 100 will be described.

Figure 5:
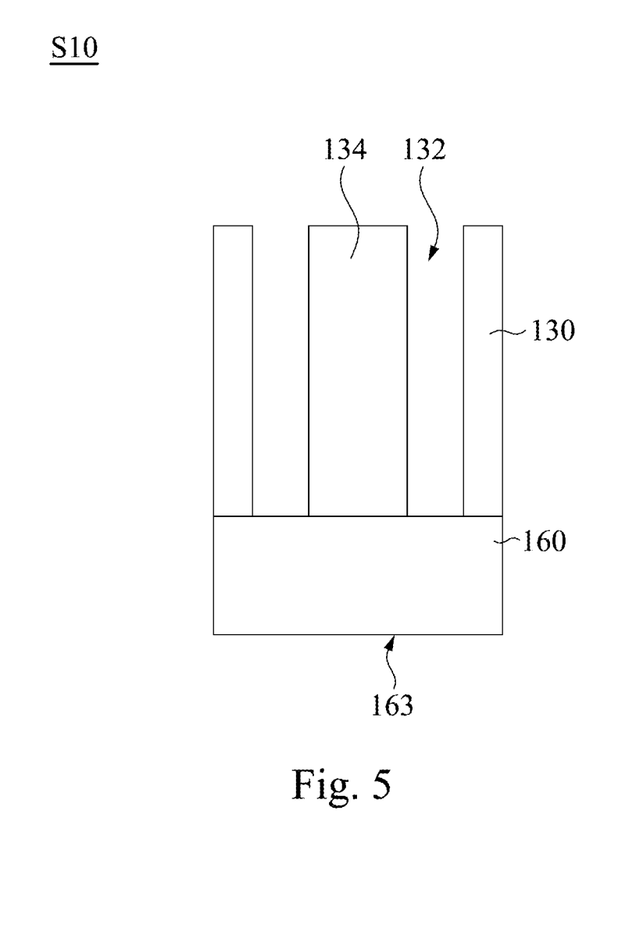
FIGS. 5-16 are cross-sectional views of a process at various stages of a manufacturing method of a semiconductor device according to an embodiment of the present disclosure.

Reference is made to FIG. 5, which is a cross-sectional view of step S10 of forming the semiconductor device 100. In step S10, the first isolation structure 160 is provided, and the gate structure 130 is formed on the first isolation structure 160. A carrier may be disposed on a bottom surface 163 of the first isolation structure 160 to carry the first isolation structure 160 and components subsequently formed thereon in the following steps. A portion of the gate structure 130 is then removed by an etching process, thereby forming a hollow region 132 surrounding a center portion 134 of the gate structure 130 shown in FIG. 5. The etching process may be a wet etching process or a dry etching process. The etching process stops when a portion of the first isolation structure 160 is exposed from the hollow region 132. In some embodiments, the hollow region 132 is formed in a doughnut shape, in a top view, but the present disclosure is not limited in this regard.

Figure 6:
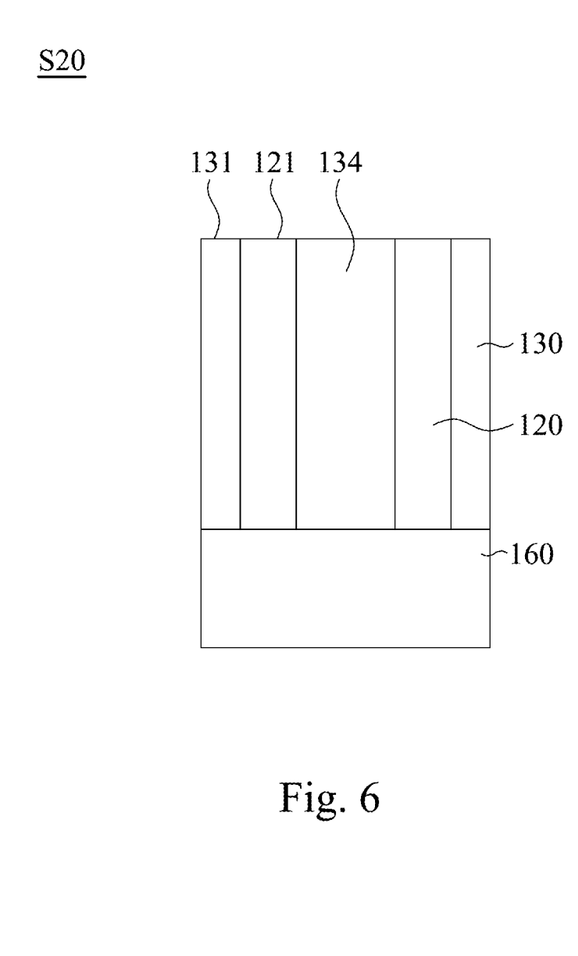

Reference is made to FIG. 6, which is a cross-sectional view of step S20 of forming the semiconductor device 100. In step S20, the hollow region 132 is then refilled with the dielectric structure 120, resulting in a replacement of the portion of the gate structure 130 with the dielectric structure 120. As such, the center portion 134 of the gate structure 130 is surrounded by the dielectric structure 120. In some embodiments, a planarization process may be performed after the replacement such that a top surface 121 of the dielectric structure 120 is substantially aligned with a top surface 131 of the gate structure 130.

Figure 7:
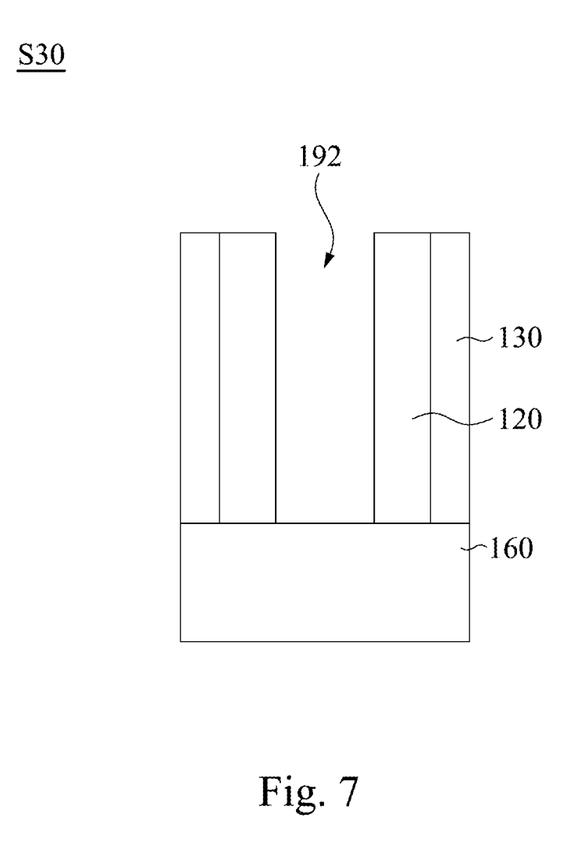

Reference is made to FIG. 7, which is a cross-sectional view of step S30 of forming the semiconductor device 100. In step S30, the center portion 134 of the gate structure 130 is removed by an etching process to form an etched space 192. The etching process stops when a portion of the first isolation structure 160 is exposed from the etched space 192. After the etching process, a remaining portion of the gate structure 130 and the dielectric structure 120 together surround the etched space 192, and a center portion of the first isolation structure 160 is exposed from the etched space 192. The etching process may be a wet etching process or a dry etching process, but the present disclosure is not limited in this regard.

Figure 8:
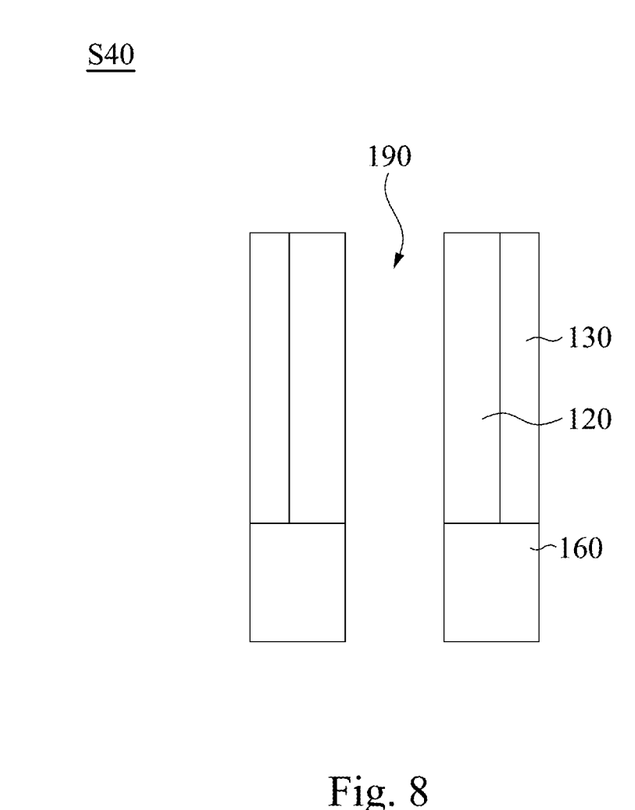

Reference is made to FIG. 8, which is a cross-sectional view of step S40 of forming the semiconductor device 100. In step S40, an etching process is further performed to remove the center portion of the first isolation structure 160. In some embodiments, the etching process may be a wet etching process or a dry etching process. As such, an etched space surrounded by a remaining portion of the first isolation structure 160 is formed. It is noted that the etched space 192 and the etched space formed in step S40 together form a through hole 190 penetrating through the semiconductor device 100.

Figure 9:
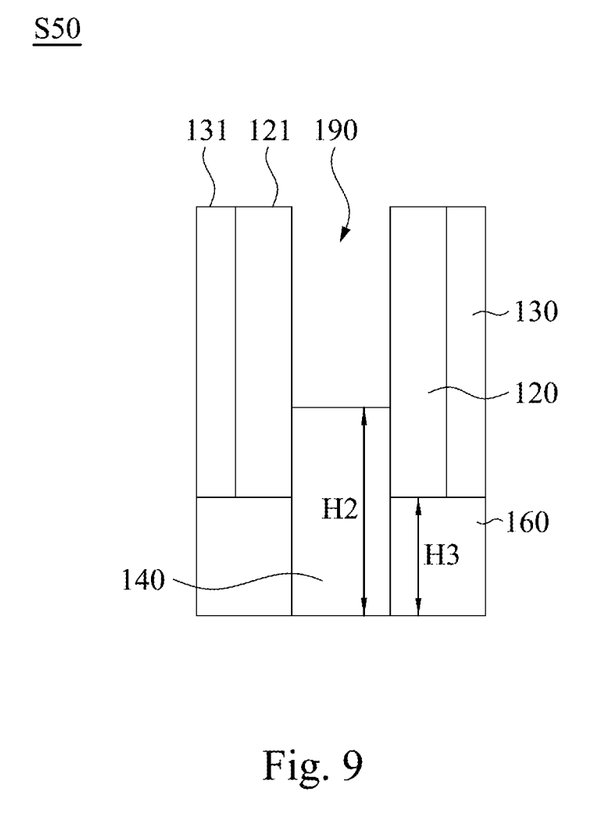

Reference is made to FIG. 9, which is a cross-sectional view of step S50 of forming the semiconductor device 100. In step S50, the first conductive structure 140 is filled in a bottom portion of the through hole 190. A mask may be disposed on the top surface 121 of the dielectric structure 120 and the top surface 131 of the gate structure 130 during a formation of the first conductive structure 140, such that the first conductive structure 140 is optionally formed in the bottom portion of the through hole 190. In some embodiments, a height H2 of the first conductive structure 140 is larger than a height H3 of the first isolation structure 160, but the present disclosure is not limited in this regard.

Figure 10:
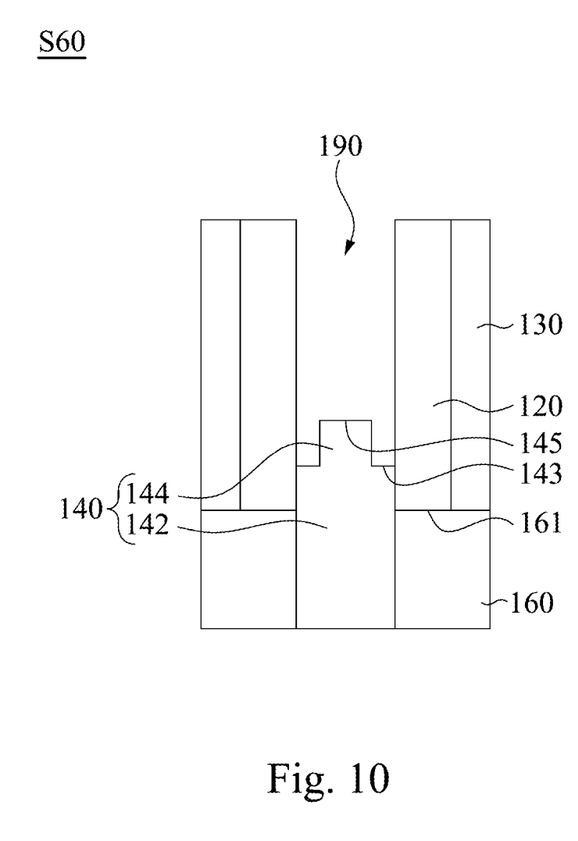

Reference is made to FIG. 10, which is a cross-sectional view of step S60 of forming the semiconductor device 100. In step S60, an etching process is performed to remove portions of the first conductive structure 140, such that the body portion 142 and the convex portion 144 are formed, and the convex portion 144 protrudes from the top surface 143 of the body portion 142. In other words, the top surface 145 of the convex portion 144 of the first conductive structure 140 is higher than the top surface 143 of the body portion 142 of the first conductive structure 140. In some embodiments, the etching process may be a wet etching process, but the present disclosure is not limited in this regard. In other embodiments, the etching process may be dry etching process such as a plasma etching process.

It is noted that although FIG. 10 illustrates only one convex portion 144 protruding from the top surface 143 of the body portion 142, more than one convex portions 144 may be formed in step S60. In some embodiments, the top surface 143 of the body portion 142 of the first conductive structure 140 may be etched to be higher than the top surface 161 of the first isolation structure 160, such that a portion of the body portion 142 of the first conductive structure 140 is in contact with the dielectric structure 120. In other embodiments, the top surface 143 of the body portion 142 of the first conductive structure 140 is etched to be substantially aligned with the top surface 161 of the first isolation structure 160.

Figure 11:
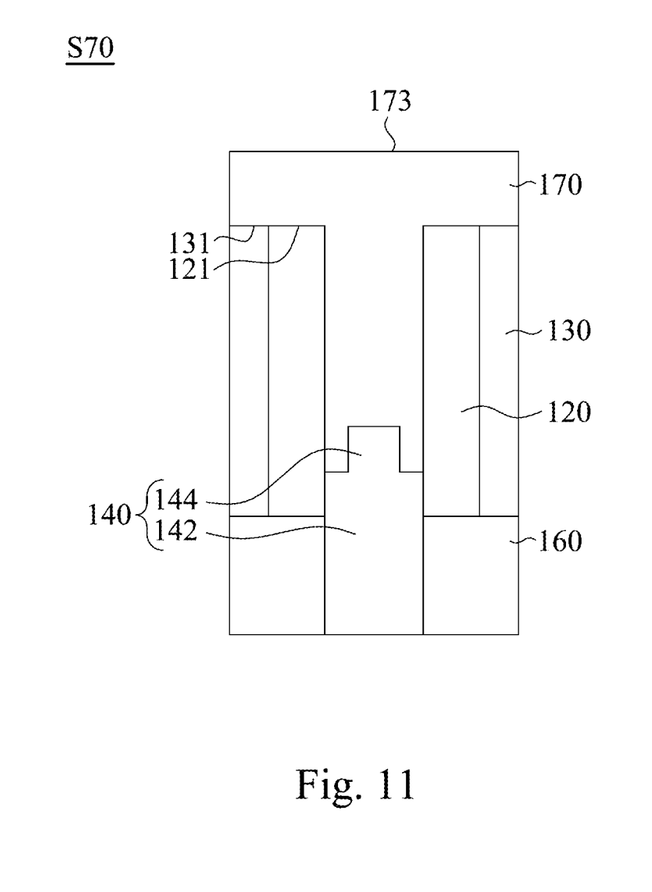

Reference is made to FIG. 11, which is a cross-sectional view of step S70 of forming the semiconductor device 100.

In step S70, the second isolation structure 170 is formed in a remaining portion of the through hole 190 and on the top surface 131 of the gate structure 130 and the top surface 121 of the dielectric structure 120. In some embodiments, a planarization process may be performed after the second isolation structure 170 is formed, such that a planarization of a top surface 173 of the second isolation structure 170 may be completed.

Figure 12:
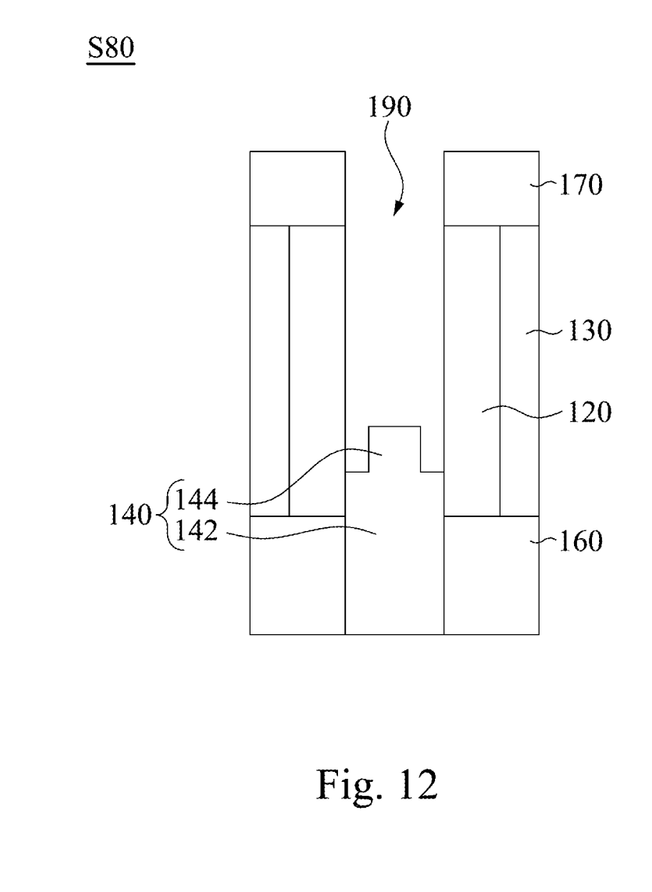

Reference is made to FIG. 12, which is a cross-sectional view of step S80 of forming the semiconductor device 100. In step S80, a portion of the second isolation structure 170 is removed by an etching process. During a removal of the portion of the second isolation structure 170, a mask may be disposed on a portion of the second isolation structure 170 which is disposed on the dielectric structure 120 and the gate structure 130, such that the remaining portion of the isolation structure 170 not being covered by the mask is removed. The etching process stops when the first conductive structure 140 is exposed from the through hole 190. The etching process may be a wet etching process or a dry etching process, but the present disclosure is not limited in this regard. After the etching process, the first conductive structure 140 is again exposed from the through hole 190.

Figure 13:
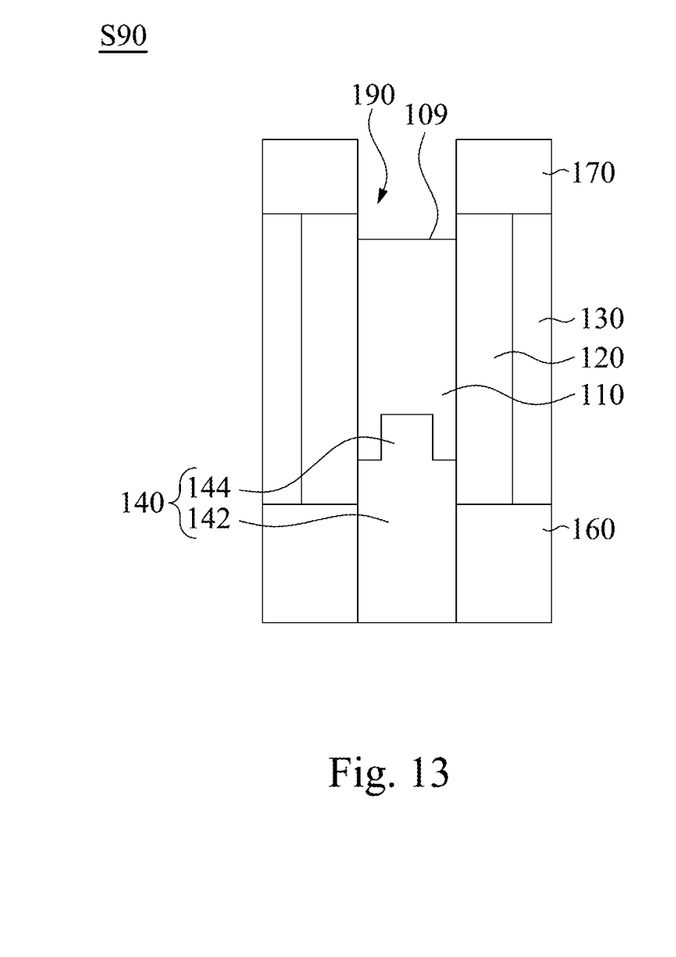

Reference is made to FIG. 13, which is a cross-sectional view of step S90 of forming the semiconductor device 100. In step S90, the channel structure 110 is filled in a portion of the through hole 190. In the embodiment, a position of a temporary top surface 109 of the channel structure 110 may be designed as deemed necessary by designers. For example, a higher position of the temporary top surface 109 of the channel structure 110 provides additional etching flexibility for a subsequent etching process in step S100 discussed below.

Figure 14:
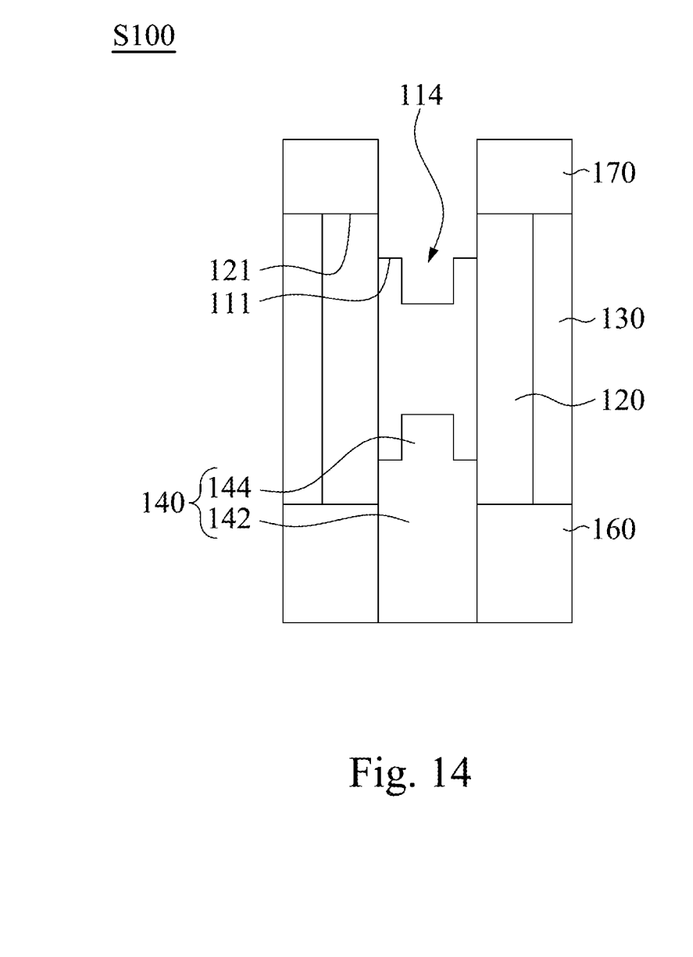

Reference is made to FIG. 14, which is a cross-sectional view of step S100 of forming the semiconductor device 100. In step S100, an etching process is then performed to form a recess 114 indenting from the top surface 111 of the channel structure 110. In some embodiments, the top surface 111 of the channel structure 110 is below the top surface 121 of the dielectric structure 120, but the present disclosure is not limited in this regard. In other embodiments, the top surface 111 of the channel structure 110 is substantially aligned with the top surface 121 of the dielectric structure 120. Furthermore, the number of the convex portion 144 of the first conductive structure 140 may be identical to a number of the recess 114 of the channel structure 110.

Figure 15:
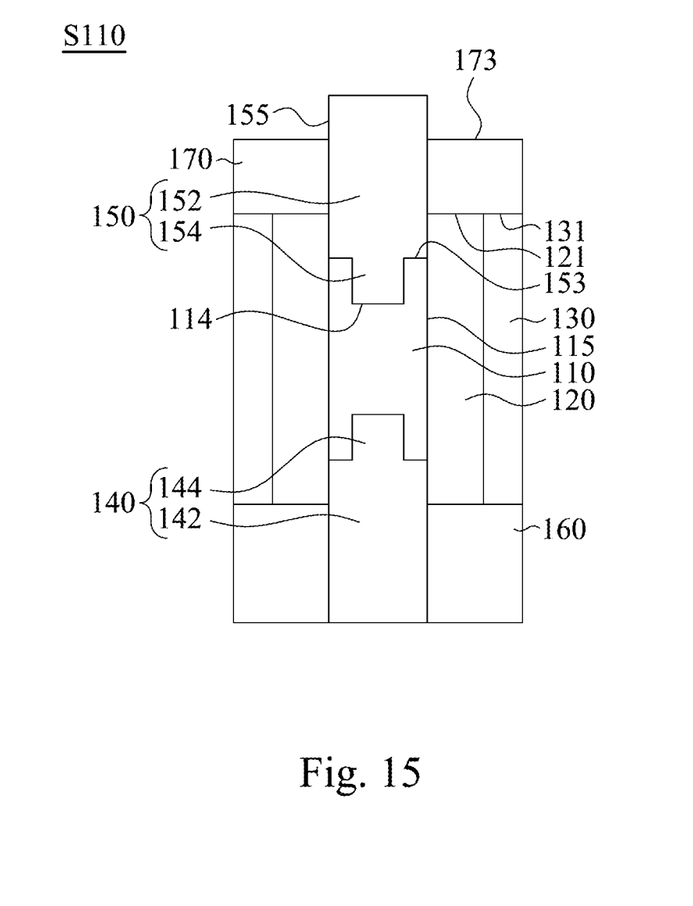

Reference is made to FIG. 15, which is a cross-sectional view of step S110 of forming the semiconductor device 100. In step S110, the second conductive structure 150 is formed on the channel structure 110 and on the top surface 173 of the second isolation structure 170. After the second conductive structure 150 is formed, an etching process is performed to remove the second conductive structure 150 disposed on the top surface 173 of the second isolation structure 170, such that the second conductive structure 150 is formed to include a body portion 152 and at least one convex portion 154, and a sidewall 155 of the body portion 152 of the second conductive structure 150 is exposed. The etching process may be a wet etching process or a dry etching process. Furthermore, the convex portion 154 of the second conductive structure 150 is engaged with the recess 114 of the channel structure 110. In some embodiments, the bottom surface 153 of the body portion 152 of the second conductive structure 150 is lower than the top surface 121 of the dielectric structure 120. In other embodiments, the bottom surface 153 of the body portion 152 of the second conductive structure 150 is substantially aligned with top surface 121 of the dielectric structure 120.

Figure 16:
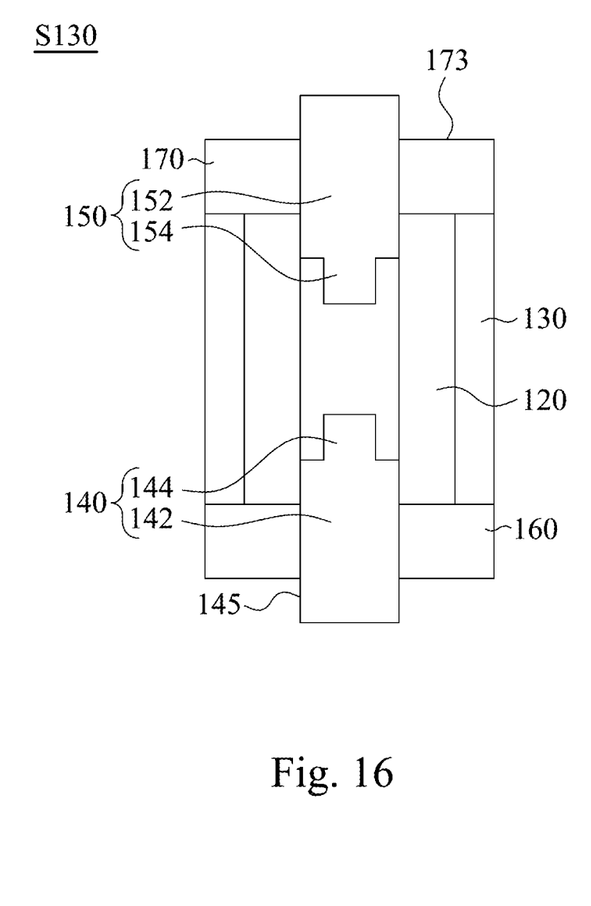

Reference is made to FIG. 16, which is a cross-sectional view of step S120 of forming the semiconductor device 100. In step S120, a portion of the first isolation structure 160 is removed by a selective etching process such that a sidewall 145 of the body portion 142 of the first conductive structure 140 is exposed. In this step, the semiconductor device 100 may be placed upside down such that the selective etching process is performed from top. In other words, the top surface 173 of the second isolation structure 170 of the semiconductor device 100 may be disposed on a carrier during the selective etching process. The selective etching process may be a wet etching process or a dry etching process performed based on the difference in an etching selectivity between the first conductive structure 140 and the first isolation structure 160. Conductive wires may be bonded between the body portion 142 of the first conductive structure 140 or the body portion 152 of the second conductive structure 150 and a capacitor 200 to electrically connect the source/grain region to the capacitor 200, as shown in FIG. 2.

After the aforementioned steps are performed, the semiconductor device 100 of a gate all around structure shown in FIG. 1 is provided. The manufacturing method of the semiconductor device 100 provides a means for forming the first conductive structure 140 (i.e., the drain region), the channel structure 110, and the second conductive structure 150 (i.e., the source region) sequentially in an oxide semiconductor thin film transistor (OS TFT). In other words, the source region and the drain region are formed in such a manner without doping, such that the source/gate and drain/gate overlap regions can be controlled.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A manufacturing method of a semiconductor device, comprising the following steps of:
   forming a gate structure on a top surface of an first isolation structure;
   replacing a portion of the gate structure with a dielectric structure;
   removing a center portion of the gate structure and a center portion of the first isolation structure to form a through hole;
   filling a first conductive structure in a bottom portion of the through hole, wherein the first conductive structure comprises a body portion and at least one convex portion, and a top surface of the convex portion of the first conductive structure is higher than a top surface of the body portion of the first conductive structure; and
   filling a channel structure in a portion of the through hole, wherein the channel structure comprises at least one recess indenting from a top surface of the channel structure; and
   forming a second conductive structure on the channel structure, wherein the second conductive structure comprises a body portion and at least one convex portion, and the convex portion of the second conductive structure is engaged with the recess of the channel structure; and
   removing a portion of the first isolation structure such that a sidewall of the body portion of the first conductive structure is exposed.

2. The manufacturing method of claim 1, further comprising:

forming a second isolation structure in a remaining portion of the through hole and on the gate structure and the dielectric structure; and removing a portion of the second isolation structure such that the first conductive structure is exposed from the through hole.

3. The manufacturing method of claim 1, wherein replacing the portion of the gate structure with the dielectric structure comprises:

removing a portion of the gate structure to form a hollow region surrounding the center portion of the gate structure; and filling the dielectric structure in the hollow region.

4. The manufacturing method of claim 1, wherein filling the first conductive structure in the bottom portion of the through hole comprises:

performing an etching process to the first conductive structure to form the convex portion of the first conductive structure.

5. The manufacturing method of claim 1, wherein filling the channel structure in the portion of the through hole comprises:

performing an etching process to the channel structure to form the recess of the channel structure.

6. The manufacturing method of claim 1, further comprising:

forming a capacitor electrically connected to the body portion of the first conductive structure or the body portion of the second conductive structure.

\* \* \* \* \*